United States Patent
Yoon et al.

(10) Patent No.: US 8,263,323 B2
(45) Date of Patent: Sep. 11, 2012

(54) METHOD OF FORMING FINE PATTERN USING BLOCK COPOLYMER

(75) Inventors: Dong Ki Yoon, Seoul (KR); Shi-yong Yi, Hwaseong-si (KR); Seok-hwan Oh, Suwon-si (KR); Kyoung-seon Kim, Suwon-si (KR); Sang Ouk Kim, Daejeon (KR); Seung-hak Park, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 394 days.

(21) Appl. No.: 12/591,427

(22) Filed: Nov. 19, 2009

(65) Prior Publication Data

US 2010/0167214 A1    Jul. 1, 2010

(30) Foreign Application Priority Data

Dec. 31, 2008 (KR) .................. 10-2008-0138549

(51) Int. Cl.
*G03F 7/26* (2006.01)
(52) U.S. Cl. ........................ 430/324; 430/325
(58) Field of Classification Search .............. 430/325, 430/313, 315
See application file for complete search history.

(56) References Cited

U.S. PATENT DOCUMENTS

| | | | |
|---|---|---|---|
| 2005/0158651 A1* | 7/2005 | Ryu et al. | 430/141 |
| 2006/0134556 A1* | 6/2006 | Nealey et al. | 430/311 |
| 2008/0193658 A1* | 8/2008 | Millward | 427/401 |

FOREIGN PATENT DOCUMENTS

| | | |
|---|---|---|
| JP | 2007-313568 A | 12/2007 |
| JP | 2008-036491 A | 2/2008 |
| KR | 10-2005-0033312 A | 4/2005 |

\* cited by examiner

*Primary Examiner* — Kathleen Duda
*Assistant Examiner* — Caleen Sullivan
(74) *Attorney, Agent, or Firm* — Lee & Morse, P.C.

(57) ABSTRACT

A method of forming a fine pattern includes forming an organic guide layer on a substrate, forming a photoresist pattern on the organic guide layer, the photoresist pattern including a plurality of openings exposing portions of the organic guide layer, forming a material layer on the exposed portions of the organic guide layer and on the photoresist pattern, the material layer including block copolymers, and rearranging the material layer through phase separation of the block copolymers into a fine pattern layer, such that the fine pattern layer includes a plurality of first blocks and a plurality of second blocks arranged in an alternating pattern, the plurality of first blocks and the plurality of the second blocks having different repeating units of the block copolymers.

18 Claims, 7 Drawing Sheets

METHOD OF FORMING FINE PATTERN USING BLOCK COPOLYMER

BACKGROUND

1. Field

Example embodiments relate to a method of forming a fine pattern for fabricating a semiconductor device, and more particularly, to a method of forming a fine pattern by using a block copolymer.

2. Description of the Related Art

As integration of semiconductor devices improves, an area occupied by each of a plurality of unit cells in the semiconductor devices is reduced. In accordance with such reduction in area, nano-scale design rules on the scale of several nanometers to dozens of nanometers are being applied, and thus demands for new methods of forming fine patterns, e.g., a fine contact hole pattern having a nano-scale opening size or a fine line pattern having a nano-scale width, are increasing.

Conventional methods of forming fine patterns, however, may have physical limitations. For example, in top-down type photolithography methods of forming fine patterns, there may be limits in improving resolution, e.g., due to limits in wavelength of light sources and resolution limits in optical systems.

SUMMARY

Embodiments are therefore directed to a method of forming a fine pattern for fabricating a semiconductor device, which substantially overcomes one or more of the problems due to the limitations and disadvantages of the related art.

It is therefore a feature of an embodiment to provide a method of forming a fine pattern with a fine pitch exceeding a resolution limit in a photolithography operation in a highly integrated semiconductor device.

At least one of the above and other features and advantages may be realized by providing a method of forming a fine pattern, the method including forming an organic guide layer on a substrate, forming a photoresist pattern, in which a plurality of openings exposing the organic guide layer are formed, on the organic guide layer, forming a material layer, which contains block copolymers, on portions of the organic guide layer exposed via the openings of the photoresist pattern and on the photoresist pattern, and forming a fine pattern layer, in which a plurality of first blocks and a plurality of second blocks are alternately and repeatedly arranged, by rearranging components of the material layer through phase separation of the material layer, wherein the plurality of first blocks and the plurality of the second blocks have different repeating units.

The organic guide layer may include an organic anti-reflective film or a hexamethyldisilazane (HDMS) film.

Each of the plurality of first blocks in the fine pattern layer may have the same width as each of the openings formed in the photoresist pattern.

The components of the material layer may be rearranged using differences of surface characteristics between the portions of the organic guide layer exposed via the openings of the photoresist pattern and the photoresist pattern.

Whichever of the plurality of first blocks or the plurality of second blocks has a greater hydrophilic profile may be self-assembled on the exposed portions of the organic guide layer.

The formation of the fine pattern layer may include annealing the material layer at a temperature higher than the glass transition temperature of the block copolymers to rearrange the components of the material layer.

The method may further include forming a fine pattern mask, which exposes the organic guide layer and a portion of the top surface of the photoresist pattern, by removing either the plurality of first blocks or the plurality of second blocks, and partially etching the exposed organic guide layer and the exposed top surface of the photoresist pattern by using the fine pattern mask as an etching mask. Furthermore, the method may include forming a film to be etched on the substrate before the organic guide layer is formed on the substrate, wherein the organic guide layer is formed on the film to be etched, and etching the film to be etched by using the fine pattern mask as an etching mask after the etching of the organic guide layer and the top surface of the photoresist pattern.

Forming the organic guide layer may include forming a film with a higher hydrophilic affinity than the photoresist pattern. Forming the photoresist pattern on the organic guide layer may include forming a photoresist pattern having a neutral surface and openings exposing hydrophilic surfaces of the organic guide layer, the neutral surface of the photoresist pattern being neither hydrophilic nor hydrophobic. The first blocks of the fine pattern layer may be formed to include first polymer blocks of the block copolymers, and the second blocks of the fine pattern layer may be formed to include second polymer blocks of the block copolymers, the first and second polymer blocks having different hydrophilic affinity. The first blocks of the fine pattern layer may be formed to include first polymer blocks of the block copolymers, and the second blocks of the fine pattern layer may be formed to include second polymer blocks of the block copolymers, the first and second polymer blocks being different polymers from each other, and the first blocks being self-assembled on the exposed portions of the organic guide layer through the phase separation. The second blocks of the fine pattern layer may be self-assembled only on the photoresist pattern through the phase separation.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
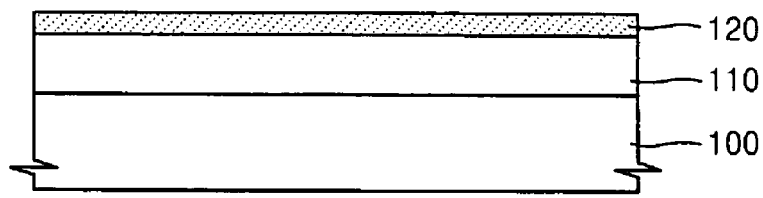
FIGS. 1A through 1H illustrate cross-sectional views of a method of forming a fine pattern according to an embodiment.

Korean Patent Application No. 10-2008-0138549, filed on Dec. 31, 2008, in the Korean Intellectual Property Office, and entitled: "Method of Forming Fine Pattern Using Block Copolymer," is incorporated by reference herein in its entirety.

According to the inventive concept, in order to embody a fine-pitch pattern required for fabrication of a semiconductor device with high integration exceeding a resolution limit in a photolithography operation, a pitch of the pattern may be adjusted using self-assembly characteristics of a polymer, and thus density of the pattern may increase. In particular, fine structures repeatedly arranged via spontaneous self-assembly may be obtained using phase separation behavior of a block copolymer. When a fine pattern is formed using the self-assembly characteristic of the block copolymer, the size of the formed fine pattern may be almost the same as a thickness of a single-molecular layer, as compared to a fine pattern formed using photolithography. Thus, a fine pattern exceeding a resolution limit of a conventional photolithography may be formed.

A block copolymer is a functional polymer formed by combining two or more polymer blocks having different structures through covalent bonding, e.g., two or more different homopolymer chains attached to each other via covalent bonding. Each polymer block in the copolymer block may have different mixing characteristic and selective solubility due to their different structures. Thus, the block copolymer may undergo phase separation or selective solubility in solid phase or liquid phase to form self-assembled structures, e.g., the block copolymer may separate into micro-polymer phases to include each of the polymer blocks of the block copolymer in a separate micro-polymer phase. The block copolymer may form a fine structure having a particular shape through self-assembly according to different physical/chemical characteristics of the block polymers therein. For example, when the block copolymer is a diblock copolymer formed of two different polymers having predetermined molecular weights, the diblock copolymer may self-assemble on a bulk substrate, so that a volume fraction of the polymers in the self-assembled structure is determined based on the predetermined respective molecular weights of the polymers. According to volume fraction, temperature, molecule sizes, etc. of each of a plurality of polymers in the copolymer block, a self-assembled structure of the block copolymer may have a particular shape. For example, the particular self-assembled structure of the block copolymer may be a three-dimensional structure, e.g., a cubic structure, a gyroid structure, etc., a two-dimensional structure, e.g., a hexagonal packed column structure, a lamellar structure, etc., and so forth. In this regard, a size of each polymer block may be proportional to the molecular weight of the polymer block.

For formation of fine patterns of a semiconductor device, block copolymers may be self-assembled in either a hexagonal column structure or a lamellar structure. In the case of a hexagonal column structure, since a hexagonal column structure is a structure formed by filling cylindrical columns into a hexagon, the orientation of such a structure may be relatively simple, e.g., a line and space structure or a pattern structure including a plurality of repeatedly arranged holes may be formed according to the orientation of the column. A lamellar structure may be formed by repeatedly stacking two-dimensional panel structures, e.g., if block copolymers of the lamellar structure extend in a direction perpendicular to a surface of a substrate, a line and space pattern with a high aspect ratio may be formed.

A self-assembled structure of a block copolymer may form a fine self-assembled structure on a scale of several nanometers to dozens of nanometers according to a size of molecules of the block copolymer. In contrast to conventional processing methods, e.g., conventional photolithography, formation of a self-assembled structure of a block copolymer may not require expensive equipment and may employ a spontaneous thermodynamic process. Thus, a number of operations may be significantly reduced. As a result, the method of forming fine patterns according to an example embodiment may be simplified as compared to the conventional methods. Furthermore, super-fine patterns on the scale of several nanometers to dozens of nanometers may be formed by using the self-assembly characteristic of a block copolymer, which may be difficult to accomplish using conventional processing methods.

To use the self-assembly characteristic of a block copolymer for formation of a fine pattern required for fabrication of a semiconductor device, a material layer containing a block copolymer may be formed as a thin film on a predetermined planar membrane on a substrate. Then, the material layer with the block copolymer may be heated to a temperature higher than a glass transition temperature of the block copolymer to induce self-assembly of the block copolymer. The self-assembly of the copolymer may be a spontaneous process, i.e., molecules may self-assemble to be in a thermodynamically stable state, and may include adjustment of the orientation of a fine structure obtained from the self-assembly of the block copolymer.

An organic guide layer, which may exhibit high affinity with respect to a polymer block having a hydrophilic radical, may be used to adjust orientation of the fine structure via orientation of the polymer block having a hydrophilic radical. A photoresist pattern with a plurality of openings may be formed on the organic guide layer for exposing portions of the organic guide layer at a predetermined pitch. Since the organic guide layer may have a higher affinity than the photoresist pattern with respect to hydrophilic radicals, and the photoresist pattern may have selectivity with respect to neither a hydrophilic radical nor a hydrophobic radical, the block copolymers may be perpendicularly aligned on the photoresist pattern.

For example, if the block copolymer includes polystyrene (PS) and polymethylmethacrylate (PMMA) polymer blocks, and the organic guide layer is a hexamethyldisilazane (HMDS) film, the HDMS may have a higher affinity to the PMMA polymer block than to the PS polymer block. In other words, when a surface of the HDMS film is coated with PS-PMMA block copolymers and annealed, PMMA may be self-assembled on the surface of the HMDS film. In this regard, any organic anti-reflective film used in conventional photolithography operations may have a higher affinity with respect to PMMA blocks than with respect to PS blocks regardless of a wavelength of a light source used in photolithography.

Furthermore, when PS-PMMA block copolymers are used, the photoresist film may have no selectivity with respect to either PS blocks or PMMA blocks. In other words, when the HMDS film is coated with a photoresist pattern and PS-PMMA block copolymers, followed by annealing, PS blocks and PMMA blocks may be formed in lamellar structures on the surface of the photoresist film and may be perpendicularly aligned with respect to the surface of the photoresist film, regardless of whether the surface of the photoresist film is plasma-treated or not. In this regard, it is noted that any suitable organic anti-reflective film, e.g., used in conventional photolithography operations, may exhibit the same behavior regardless of the wavelength of a light source used in photolithography.

Therefore, in a method of forming a fine pattern according to the inventive concept, the photoresist pattern exposing portions of the organic guide layer at a predetermined pitch may be formed on the organic guide layer, and spontaneous self-assembly of block copolymers on the organic guide layer and the photoresist pattern may be induced by using portions of the organic guide layer exposed via the photoresist pattern as guides.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the scope of the inventive concept to those skilled in the art. In the drawings, various elements and regions are roughly shown. Thus, the inventive concept may be not limited to relative sizes or intervals depicted in the accompanying drawings.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1A through 1H illustrate cross-sectional views of a method of forming a fine pattern according to an embodiment.

Referring to FIG. 1A, a target film 110 may be formed on a substrate 100, and an organic guide layer 120 may be formed on the target film 110, i.e., the target film 110 may be formed between the substrate 100 and the organic guide layer 120. The target film 110 refers to a film to be etched into a fine-pitched pattern.

The target film 110 may be either an insulation film or a conductive film. For example, the target film 110 may be an insulation film, e.g., one or more of an oxide film, a nitride film, an oxynitride film, etc., or a metal film, e.g., one or more of Au film, Pt film, Cu film, etc. The target film 110 may be selectively omitted.

The organic guide layer 120 may be an organic film. For example, the organic guide layer 120 may be formed of an organic anti-reflective film or a HDMS film.

If the organic guide layer 120 is formed of a HDMS film, a separate anti-reflective film (not shown) may be further formed between the target film 110 and the organic guide layer 120.

If the organic guide layer 120 is formed of an anti-reflective film, any suitable anti-reflective film, e.g., any film used in conventional photolithography operations, may be used. For example, the organic guide layer 120 may be formed of, e.g., one or more of an anti-reflective coating (ARC) material for KrF excimer laser, an ARC material for ArF excimer laser, or an ARC material for other light sources. In another example, any ARC materials used in dry lithography operations or immersion lithography operations may be used to form the organic guide layer 120. For example, any of the "NCA" series products and the "NCST" series products (Nissan Chemical Industries, Ltd.), the "XP" series products (Rohm and Hass Electronic Materials (RHEM)), and the "SNSA" series products (ShinEtsu Chemical Co.) may be used to form the organic guide layer 120.

To form the organic guide layer 120, a surface of the target film 110, i.e., a surface facing away from the substrate 100, may be coated, e.g., with an organic ARC material and may be annealed to crosslink the organic ARC material.

Figure 1B:
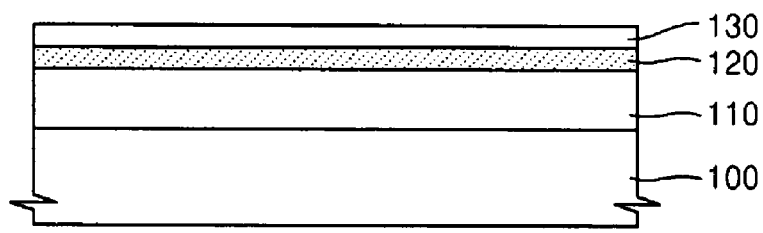

Referring to FIG. 1B, a photoresist film 130 may be formed on the organic guide layer 120. In other words, the organic guide layer 120 may be positioned between the photoresist film 130 and the target film 110.

Any suitable photoresist material, e.g., materials for i-line, materials for KrF, materials for ArF, materials for EUV, materials used in conventional photolithography operations, etc., may be used to form the photoresist film 130, regardless of the type of light source used in a photolithography process. The photoresist film 130 may also be formed of a chemically-amplified resist material.

Figure 1C:
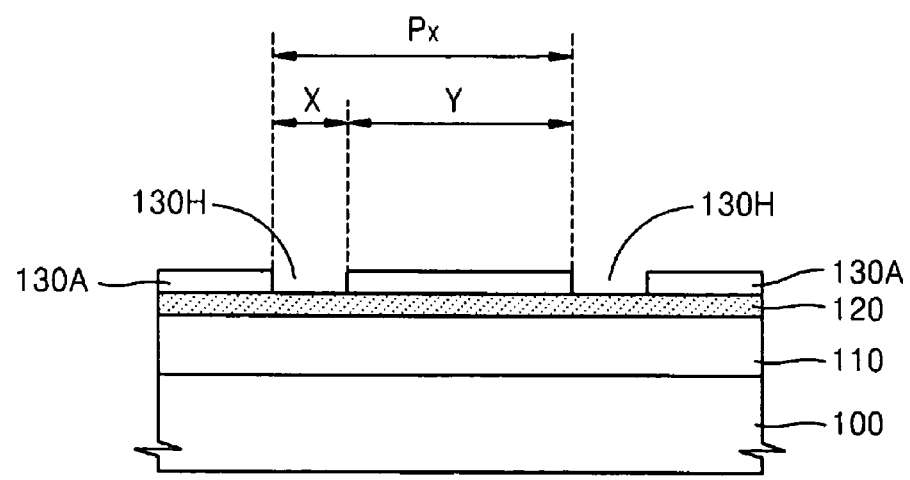

Referring to FIG. 1C, the photoresist film 130 may be exposed to light and may be developed into a photoresist pattern 130A having a predetermined pattern. Thus, the photoresist pattern 130A may partially expose the organic guide layer 120.

In other words, the photoresist pattern 130A may include openings 130H formed in the photoresist pattern 130A. The openings 130H may expose portions of the organic guide layer 120, e.g., an upper surface of the organic guide layer 120 facing away from the substrate 100.

The openings 130H of the photoresist pattern 130A may have any suitable cross section, i.e., a cross-section along a plane substantially parallel to a surface supporting the substrate 100. For example, a top-view shape of the openings 130H of the photoresist pattern 130A may have an open structure, e.g., one or more of a straight line, a curved line, or a line having at least one bending point as will be discussed with reference to FIGS. 3 and 4. In another example, the top-view shape of the openings 130H of the photoresist pattern 130A may have a closed structure, e.g., one or more of a circular line or an elliptical line centering around a predetermined location on the substrate 100 as will be discussed with reference to FIG. 5.

A single opening 130H of the plurality of openings 130H of the photoresist pattern 130A may have a first width X. A portion of the photoresist pattern 130A between two adjacent openings 130H may have a second width Y. Here, a relationship between the first width X and the second width Y may be expressed using Equation 1 below.

$$Y=(2n+1)X \qquad \text{Equation 1}$$

In Equation 1, n is a positive integer, and may be any number randomly determined by a user according to the type of a block copolymer used in subsequent operations, the molecular weight of the block copolymer, and the first width X of the opening 130H. In the current embodiment, a case in which n=1 is described as an example.

For example, the photoresist pattern 130A may be formed by a conventional photolithography process, so the first width X of the openings 130H may have any width within a resolution limit of the conventional photolithography process. In another example, the photoresist pattern 130A may be obtained by forming a photoresist pattern having a width within the resolution limit of the conventional photolithography process, followed by either a thermal flow operation or a chemical attachment process (CAP) thereon to reduce widths of the openings 130H of the photoresist pattern 130A.

In the photoresist pattern 130A, the openings 130H may be repeatedly formed, such that the photoresist pattern 130A may have a first pitch $P_x$. The first pitch $P_x$ may be defined as a sum of the first and second widths X and Y, as illustrated in FIG. 1C, i.e., $P_x=X+Y$.

Figure 1D:
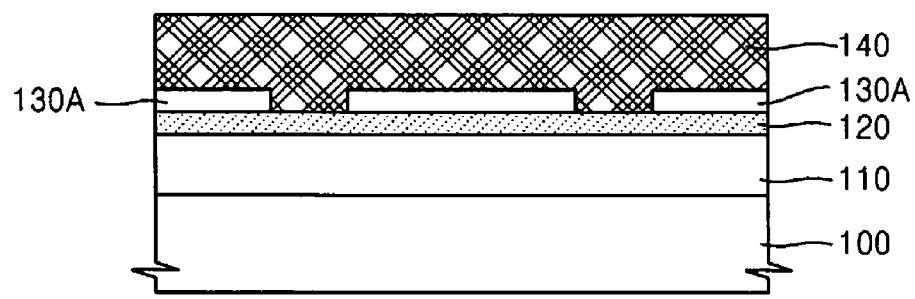

Referring to FIG. 1D, a material layer 140 may be formed on the photoresist pattern 130A and the organic guide layer

120. The material layer 140 may include a block copolymer. The material layer 140 may cover an upper surface of the photoresist pattern 130A, i.e., a surface facing away from the substrate 100, and may be on exposed portions of the organic guide layer 120, i.e., in the openings 130H. The material layer 140 may be formed using, e.g., a spin coating method.

The material layer 140 may include a block copolymer formed of at least two polymer blocks. For example, the block copolymer in the material layer 140 may be a block copolymer formed by combining a first polymer block and a second polymer block through covalent bonding at a volume ratio of 1:1. Alternatively, the block copolymer may be a double copolymer AB formed of two types of block copolymers A and B, a triple copolymer ABA formed of two types of block copolymers A and B, a triple copolymer ABC formed of three types of block copolymers A, B, and C, or a multi-component block copolymer. The block copolymer may be formed of linear polymers or branched polymers either of which may have a molecular weight in a range of about 3,000 g/mol to about 2,000,000 g/mol.

For example, if the block copolymer is a double copolymer formed of a first polymer block and a second polymer block, i.e., an AB copolymer block including A polymer and B polymer, the block copolymer may be PS-PMMA, polybutadiene-polybutylmethacrylate, polybutadiene-polydimethylsiloxane, polybutadiene-PMMA, polybutadiene-polyvinylpyridine, polybutylacrylate-PMMA, polybutylacrylate-polyvinylpyridine, polyisoprene-polyvinylpyridine, polyisoprene-PMMA, polyhexylacrylate-polyvinylpyridine, polyisobutylene-PMMA polyisobutylene-polybutylmethacrylate, polyisobutylene-polybutylmethacrylate, polyisobutylene-polydimethylsiloxane, polybutylmethacrylate-polybutylacrylate, polyethylethylene-PMMA, PS-polybutylmethacrylate, PS-polybutadiene, PS-polyisoprene, PS-polydimethylsiloxane, PS-polyvinylpyridine, polyethylethylene-polyvinylpyridine, polyethylene-polyvinylpyridine, polyvinylpyridine-PMMA, polyethyleneoxide-polyisoprene, PS-polyethyleneoxide, polyethyleneoxide-polybutadiene, polyethyleneoxide-PS, polyethyleneoxide-PMMA, polyethyleneoxide-polydimethylsiloxane, or the like.

In another example, if the block copolymer is a triple copolymer formed of a first polymer block and a second polymer block, i.e., an ABA copolymer block including A polymer and B polymer, the block copolymer may be PS-PMMA-PS, polybutadiene-polybutylmethacrylate-polybutadiene, PS-polyethyleneoxide-PS, polybutadiene-polydimethylsiloxane-polybutadiene, polybutadiene-PMMA-polybutadiene, polybutadiene-polyvinylpyridine-polybutadiene, polybutylacrylate-PMMA-polybutylacrylate, polybutylacrylate-polyvinylpyridine-polybutylacrylate, polyisoprene-polyvinylpyridine-polyisoprene, polyisoprene-PMMA-polyisoprene, polyhexylacrylate-polyvinylpyridine-polyhexylacrylate, polyisobutylene-polybutylmethacrylate-polyisobutylene, polyisobutylene-PMMA-polyisobutylene, polyethyleneoxide-PS-polyethyleneoxide, polyisobutylene-polybutylmethacrylate-polyisobutylene, polyisobutylene-polydimethylsiloxane-polyisobutylene, polybutylmethacrylate-polybutylacrylate-polybutylmethacrylate, polyethylethylene-PMMA-polyethylethylene, PS-polybutylmethacrylate-PS, PS-polybutadiene-PS, PS-polydimethylsiloxane-PS, PS-polyvinylpyridine-PS, polyethylethylene-polyvinylpyridine-polyethylethylene, polyethylene-polyvinylpyridine-polyethylene, polyvinylpyridine-PMMA-polyvinylpyridine, polyethyleneoxide-polyisoprene-polyethyleneoxide, PS-polyisoprene-PS, polyethyleneoxide-polybutadiene-polyethyleneoxide, polyethyleneoxide-PMMA-polyethyleneoxide, polyethyleneoxide-polydimethylsiloxane-polyethyleneoxide, or the like.

However, block copolymers that may be used in the inventive concept are not limited thereto, and various other block copolymers may be used within the spirit and scope of the inventive concept.

In yet another example, the material layer 140 may include a block copolymer formed by combining a first polymer block and a second polymer block through covalent bonding at a volume ratio of about 1:1, a first homopolymer having the same repeating unit as the first polymer block, and a second homopolymer having the same repeating unit as the second polymer block. For example, if the block copolymer in the material layer 140 is a PS-PMMA block copolymer, the material layer 140 may include a PS-PMMA block copolymer, PS as the first homopolymer, and PMMA as the second homopolymer. The additional amounts of the first and second homopolymers in the material layer 140 may be the same. For example, the amount of the first homopolymer and the second homopolymer may be in a range of about 0 weight % to about 60 weight % of a weight of the block copolymer When the first homopolymer and the second homopolymer are used in the material layer 140, each of the first and second homopolymers in each of the block copolymers may have a molecular weight in a range of about 500 g/mol to about 7,000 g/mol. When the first and second homopolymers are added to the block copolymers in the material layer 140, time required for the block copolymers and homopolymers to rearrange and form a self-assembled structure on an underlayer in subsequent operations may be reduced, as compared to a self-assembled structure including only a block copolymer without homopolymers. Furthermore, when each of the first homopolymer and the second homopolymer added to each of the block copolymers has a molecular weight in a range of about 500 g/mol to about 1,000,000 g/mol, pitch of a resultant self-assembled structure, i.e., when the block copolymers form the self-assembled structure in subsequent operations, may be increased, as compared to a self-assembled structure including only a block copolymer without homopolymers. Therefore, a self-assembled structure having a desired pitch may be formed by adjusting molecular weights and amounts of first and second homopolymers relative to the block copolymer in the material layer 140.

Figure 1E:
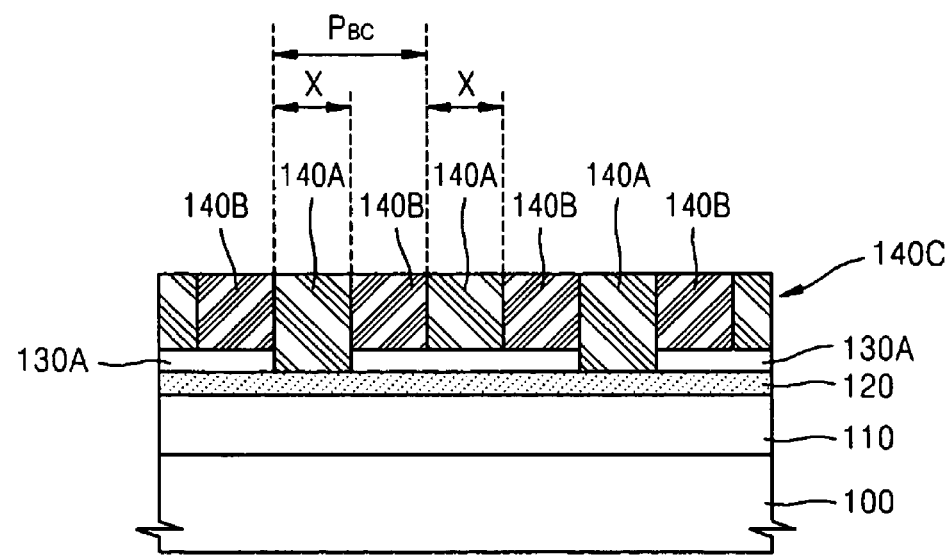

Referring to FIG. 1E, a fine pattern layer 140C including a plurality of first blocks 140A and a plurality of second blocks 140B may be formed by rearranging the material layer 140 through phase separation and self-assembly. The plurality of first blocks 140A and the plurality of second blocks 140B may be formed of monomer units containing different components.

The plurality of first blocks 140A and the plurality of second blocks 140B may have different polarizations, i.e., orientation, according to structures of repeating units of polymers constituting the plurality of first blocks 140A and the plurality of second blocks 140B. For example, if the first blocks 140A include hydrophilic radicals, the organic guide layer 120 may have high affinity with respect to the first blocks 140A, so the first blocks 140A may be arranged thereon during phase separation. On the other hand, the photoresist pattern 130A may not have selectivity, e.g., with respect to either hydrophilic or hydrophobic radicals, so both first and second blocks 140A and 140B may be arranged thereon during phase separation.

In detail, polymer blocks of the block copolymer phase-separated from the material layer 140 may be polarized differently according to their hydrophilic radicals. Since the organic guide layer 120 has affinity with respect to polymer blocks having a greater hydrophilic profile or greater polarization from among the polymer blocks, polymer blocks having greater hydrophilic profile or greater polarizations may be attracted to the exposed portions of the organic guide layer 120, i.e., openings 130H. Thus, the first polymer blocks may be self-arranged on, e.g., directly on, the exposed portions of the organic guide layer 120 to fill, e.g., completely fill, the openings 130H to form the first blocks 140A. Since the photoresist pattern 130A does not have selectivity with respect to either a polymer block having a hydrophilic radical or a polymer block having a hydrophobic radical, polymer blocks, e.g., both first and second polymer blocks, may be aligned perpendicularly on the photoresist pattern 130A. As a result, as illustrated in FIG. 1E, the first blocks 140A within the material layer 140 may be aligned in parallel on the exposed portions of the organic guide layer 120. As further illustrated in FIG. 1E, second blocks 140B within the material layer 140 may be arranged on the photoresist pattern 130A. The first and second blocks 140A and 140B may be arranged repeatedly and alternately, e.g., a first block 140A may be between two adjacent second blocks 140B. Thus, pattern density may be multiplied. For example, as illustrated in FIG. 1E, some of the first blocks 140A may be arranged on the photoresist pattern 130A between adjacent second blocks 140B.

Rearrangement of the material layer 140 through phase separation may be achieved by annealing the material layer 140 at a temperature greater than a glass transition temperature Tg_BC of the block copolymer within the material layer 140. For example, the material layer 140 may be annealed at a temperature in a range of about 100° C. to about 400° C. for about 1 hour to about 24 hours for phase separation of the material layer 140. In this regard, the material layer 140 may be annealed at a temperature that is higher than the glass transition temperature Tg_BC of the block copolymer within the material layer 140 and lower than the glass transition temperature Tg_PR of the photoresist pattern 130A. Thus, thermal flow of the photoresist pattern 130A may be prevented or minimized, and thus the photoresist pattern 130A may not be deformed. The glass transition temperature Tg_BC of the block copolymer within the material layer 140 may vary according to the molecular weight of the block copolymer. However, even if the material layer 140 is annealed at a temperature higher than the glass transition temperature Tg_PR of the photoresist pattern 130A, the first blocks 140A of the fine pattern layer 140C formed by annealing the material layer 140, and which may be self-arranged on the exposed portions of the organic guide layer 120, may fill, e.g., completely fill, the openings 130H of the photoresist pattern 130A. Thus, since the openings 130H are filled by the first blocks 140A, portions of the photoresist pattern 130A may be restricted by the first blocks 140A, so thermal flow of the photoresist pattern 130A, e.g., into spaces between adjacent portions of the photoresist pattern 130A, may be prevented or substantially minimized. Therefore, an effect on the fine pattern layer 140C by thermal flow of the photoresist pattern 130A due to heat, i.e., annealing of the material layer 140, is negligible.

According to another method of rearranging the material layer 140 through phase separation of the material layer 140, the structure including the material layer 140 on the substrate 100 with the layers 120 and 130 therebetween may be kept inside a processing chamber for a predetermined time period. The processing chamber may have an internal atmosphere saturated with toluene vapor.

Due to annealing, the structure of the block copolymer in the material layer 140 may be rearranged, so the polymer blocks in the block copolymer of the material layer 140 having greater polarization may be self-arranged on, e.g., directly on, the exposed portions of the organic guide layer 120 and may cover the exposed portions of the organic guide layer 120. The first polymer blocks and the second polymer blocks may be perpendicularly aligned with respect to the photoresist pattern 130A, such that the first polymer blocks and the second polymer blocks may have a substantially same width and may be alternately and repeatedly arranged.

For example, if the first polymer blocks have greater polarization than the second polymer blocks, the first polymer blocks may be self-arranged on the exposed portions of the organic guide layer 120 to form the first blocks 140A, as illustrated in FIG. 1E. The first blocks 140A may have a substantially constant width, i.e., may substantially equal the first width X of the opening 130H, and may be repeatedly arranged on the substrate 100 at substantially constant intervals, i.e., on the photoresist pattern 130A and on the exposed portions of the organic guide layer 120, using the exposed portions of the organic guide layer 120 as a guide. The second polymer blocks may form the second blocks 140B, so the second blocks 140B may have a substantially same width as the first blocks 140A. The second polymer blocks may not have hydrophilic radicals and, therefore, may be arranged on the photoresist pattern 130A between adjacent first blocks 140A. Thus, the first and second blocks 140A and 140B may be arranged alternately to define a fine pattern having a predetermined shape, i.e., a pattern defined by alternately arranged first and second blocks 140A and 140B.

For example, when block copolymers within the material layer 140 are PS-PMMA block copolymers, the first blocks 140A on the exposed portions of the organic guide layer 120 may include PMMA polymer, i.e., a polymer having a greater polarization as compared to the photoresist pattern 130A and being relatively more hydrophilic than the PS polymer. The second blocks 140B may be formed of PS on the photoresist pattern 130A.

In the fine pattern layer 140C, the first blocks 140A may have the same width X' as the first width X of the openings 130H of the photoresist pattern 130A. Furthermore, the first blocks 140A may be repeatedly arranged at a second pitch $P_{BC}$, which may be less than the first pitch $P_x$, i.e., the second pitch $P_{BC}$ may be smaller than a pitch produced by a conventional photolithography process.

A sum of the width X of the first blocks 140A, i.e., the first width X of the openings 130H of the photoresist pattern 130A, and the second width Y of the photoresist pattern 130 may substantially equal the first pitch $P_x$ described previously. The second pitch $P_{BC}$ may be expressed as Equation 2 below.

$$P_{BC}=[1/(n+1)] \cdot P_x \quad \text{Equation 2}$$

In Equation 2, n is the same n as in Equation 1 described above. As stated previously, in the current embodiment n=1 is described as an example. For example, if n=1, the second pitch $P_{BC}$, i.e., a pitch achieved by self-arrangement of the block copolymer, may equal about ½ of the first pitch $P_x$, i.e., a pitch achieved by conventional photolithography.

If the material layer 140 is formed of the block copolymer, e.g., including a first polymer block and a second polymer block, a first homopolymer having the same repeating unit as the first polymer block, and a second homopolymer having the same repeating unit as the second polymer block, the first blocks 140A may include the first polymer blocks and the first homopolymers. In this case, the first blocks 140A may be self-arranged on the exposed portions of the organic guide layer 120. The first blocks 140A may have a substantially constant width and may be repeatedly arranged on the photoresist pattern 130A at constant intervals, using the exposed portions of the organic guide layer 120 as a guide. The second blocks 140B may include the second polymer blocks and the second homopolymers, and may be self-arranged on the photoresist pattern 130A alternately with the first blocks 140A. The time required to form such a self-assembled structure may be reduced, and the second pitch $P_{BC}$ may be increased by adding the first homopolymers and the second homopolymers, as compared to a case of not adding the homopolymers.

Figure 1F:
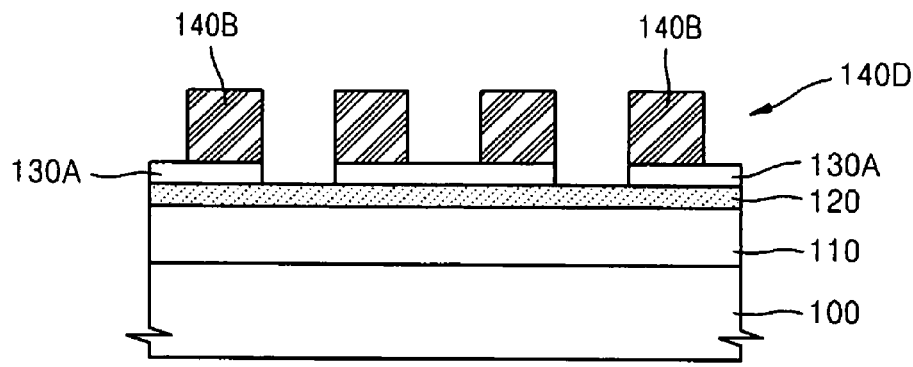

Referring to FIG. 1F, a fine pattern mask 140D may be formed by removing either the plurality of first blocks 140A or the plurality of second blocks 140B in the fine pattern layer 140C. For example, as illustrated in FIG. 1F, the plurality of the first blocks 140A may be removed, so the fine pattern mask 140D may include only the plurality of the second blocks 140B on the of the photoresist pattern 130A. As illustrated in FIG. 1F, the fine pattern mask 140D may partially expose the organic guide layer 120 and the top surface of the photoresist pattern 130A. However, the inventive concept may be not limited thereto, and the fine pattern mask 140D may be formed by removing the plurality of second blocks 140B. The effect of the inventive concept may also be obtained in the latter case.

For example, to remove either of the plurality of first blocks 140A or the plurality of second blocks 140B, the blocks to be removed may be photo-decomposed by irradiating UV light onto the blocks. In another example, the blocks to be removed may be exposed to oxygen plasma, and photo-decomposed portions of the blocks may be stripped, e.g., by using a cleaning liquid.

Figure 1G:

Referring to FIG. 1G, the exposed portions of the organic guide layer 120, the exposed portions of the photoresist pattern 130A, and the target layer 110 may be etched by using the fine pattern mask 140D as an etching mask. Thus, the target film 110 may be etched into a desired fine pattern 110A. If the target film 110 is not included, the substrate 100 may be etched by using the fine pattern mask 140D as an etching mask to form a desired fine pattern.

Figure 1H:
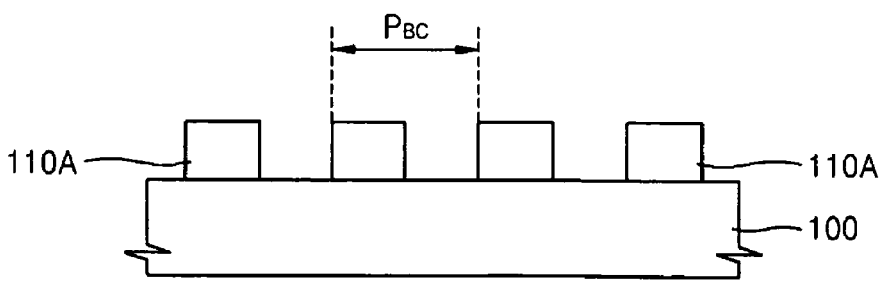

Referring to FIGS. 1G and 1H, the fine pattern mask 140D may be removed. Further, unnecessary films remaining on the fine pattern 110A, e.g., remaining portions of the organic guide layer 120 and the photoresist pattern 130A, may be removed.

The fine pattern 110A on the substrate 100 may correspond to the fine pattern mask 140D, and may have a pitch that substantially equals the second pitch $P_{BC}$. For example, the pitch of the fine pattern 110A may equal about ½ of the first pitch $P_x$ of the photoresist pattern 130A illustrated in FIG. 1C. Therefore, the fine pattern 110A may be twice as dense as the photoresist pattern 130A formed by the exposed portions of the organic guide layer 120.

Although the method of forming a fine pattern according to the current embodiment of the inventive concept described with reference to FIGS. 1A through 1H is described by exemplifying a case where n=1, it may be clear that the inventive concept may be equally applied to cases where n=2, 3, 4, and so on. A case where n=3 will be described in more detail below.

FIGS. 2A through 2D illustrate cross-sectional views of a method of forming a fine pattern according to another embodiment.

The method described with reference to FIGS. 2A through 2D may be identical to the method described previously with reference to FIGS. 1A through 1H, with the exception of n=3.

In FIGS. 2A through 2D, like reference numerals in FIGS. 1A through 1H denote like elements, and thus descriptions thereof will be omitted.

Figure 2A:
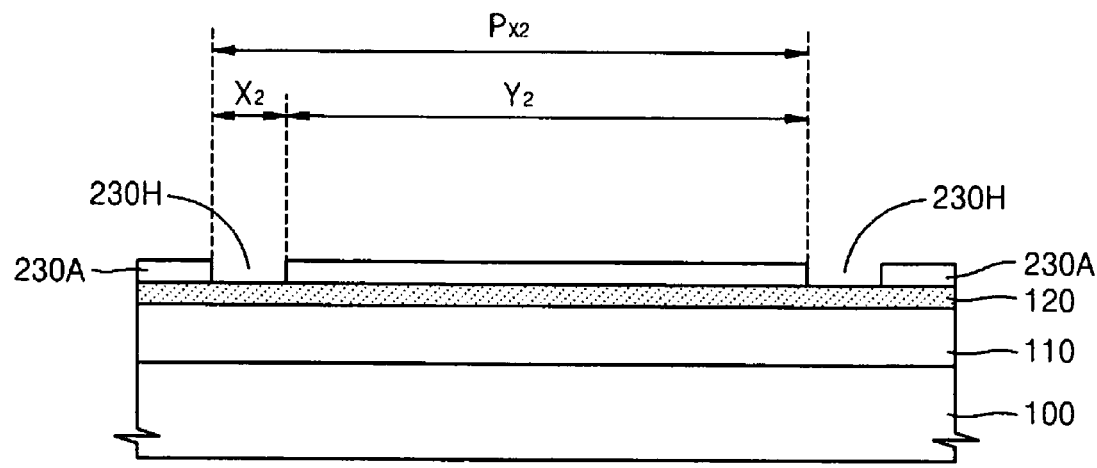
FIGS. 2A through 2D illustrate cross-sectional views of a method of forming a fine pattern according to another embodiment.

Referring to FIG. 2A, the target film 110 and the organic guide layer 120 may be sequentially formed on the substrate 100, and a photoresist pattern 230A partially exposing the organic guide layer 120 may be formed on the organic guide layer 120, as described above with reference to FIGS. 1A through 1C.

The photoresist pattern 230A may be formed of the same material as that of the photoresist film 130 described above with reference to FIG. 1B.

If n=3, according to Equation 1, a width $Y_2$ of the photoresist pattern 230A may equal about 7 times a width $X_2$, i.e., a width of a single opening 230H of the plurality of openings 230H formed in the photoresist pattern 230A. In the photoresist pattern 230A, the openings 230H may be repeatedly formed at a pitch $P_{X2}$.

Figure 2B:
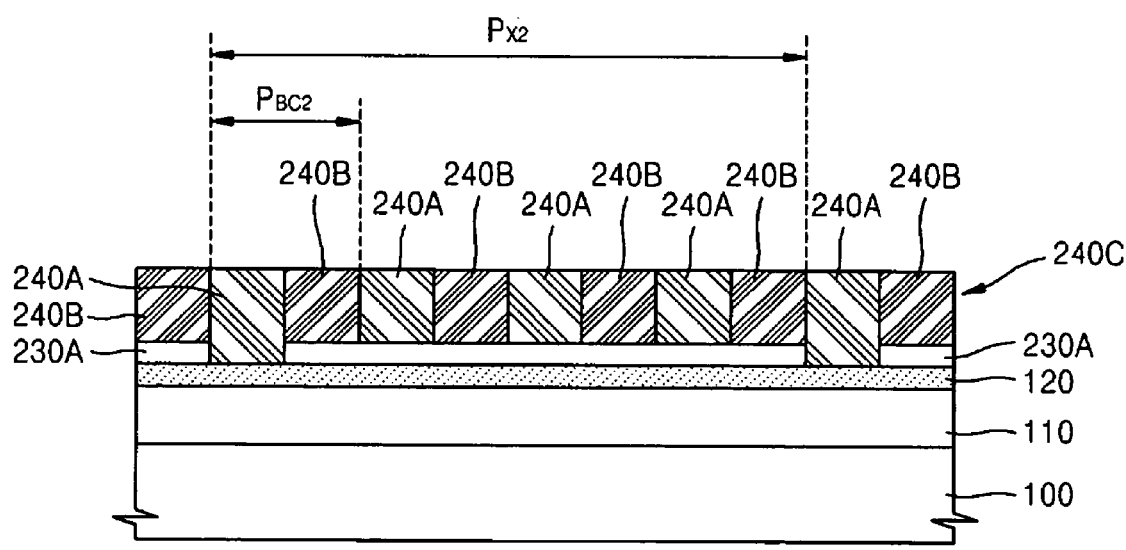

Referring to FIG. 2B, after the material layer 140 containing a block copolymer is formed on the photoresist pattern 230A and the exposed portion of the organic guide layer 120, as described previously with reference to FIGS. 1D and 1E, components of the material layer 140 may be rearranged through phase separation of the material layer 140. Thus, a fine pattern layer 240C including a plurality of first blocks 240A and a plurality of second blocks 240B may be formed, wherein the plurality of first blocks 240A and the plurality of second blocks 240B may include monomer units having different components.

For example, if a block copolymer within the material layer 140 is a PS-PMMA block copolymer, the first blocks 240A may be self-assembled and formed on the exposed portions of the organic guide layer 120, i.e., a layer having a greater polarization than the photoresist pattern 230A, and may include PMMA that is more hydrophilic than PS. The second blocks 240B may be formed on the photoresist pattern 230A and may include PS.

The detailed configuration of the fine pattern layer 240C including the plurality of first blocks 240A and the plurality of second blocks 240B may be almost identical to that of the fine pattern layer 140C including the plurality of first blocks 140A and the plurality of second blocks 140B. However, if n=3, according to Equation 2, the pitch $P_{BC2}$ of the fine pattern layer 240C, i.e., with respect to arrangement of the first blocks 240A and the second blocks 240B, may be reduced to about ¼ of the pitch P. Thus, the fine pattern layer 240C may be about 4 times as dense as the photoresist pattern 230A.

Figure 2C:
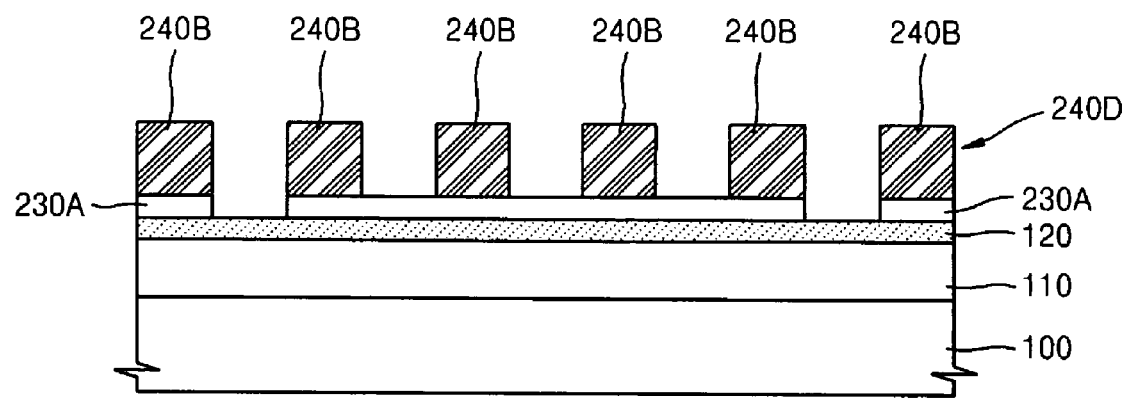

Referring to FIG. 2C, a fine pattern mask 240D, which partially exposes the organic guide layer 120 and the top surface of the photoresist pattern 230A, may be formed by removing either of the plurality of first blocks 240A or the plurality of second blocks 240B in the fine pattern layer 240C, as described above with respect to the fine pattern 140C in reference to FIG. 1F. FIG. 2C shows a case in which the plurality of first blocks 240A may be removed. However, the inventive concept is not limited thereto, and the fine pattern mask 240D may be formed by removing the plurality of second blocks 240B.

Figure 2D:
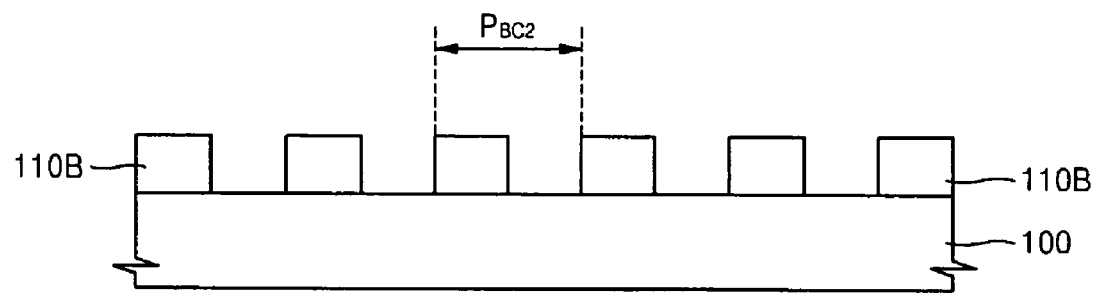

Referring to FIG. 2D, the exposed portions of the organic guide layer 120, the exposed portions of the photoresist pattern 230A, and the organic guide layer 120 therebelow may be etched by using the fine pattern mask 240D as an etching mask, i.e., as described above with reference to FIGS. 1G and 1H. Therefore, the target film 110 may be etched by using the fine pattern mask 240D as an etching mask to form a desired fine pattern 110B.

Then, the fine pattern mask 240D may be removed, and unnecessary films remaining on the fine pattern 110B may be removed.

The fine pattern 110B may have a second pitch $P_{BC2}$, which may be about ¼ of the pitch $P_{X2}$ of the plurality of openings 230H formed in the photoresist pattern 230A. Therefore, the fine pattern 110B may be about 4 times as dense as the pattern formed by the plurality of openings 230H.

Fine patterns having various top-view shapes may be formed using the methods of forming a fine pattern according to the embodiments of the inventive concept described with reference to FIGS. 1A through 1H and FIGS. 2A through 2D. For example, fine patterns having various top-view shapes, e.g., a straight or curved line and space pattern, a linear line pattern having at least one bending point, a circular or elliptical line and space pattern centering around a predetermined location on the substrate 100, etc., may be formed by using a method of forming a fine pattern according to an embodiment.

Figure 3:
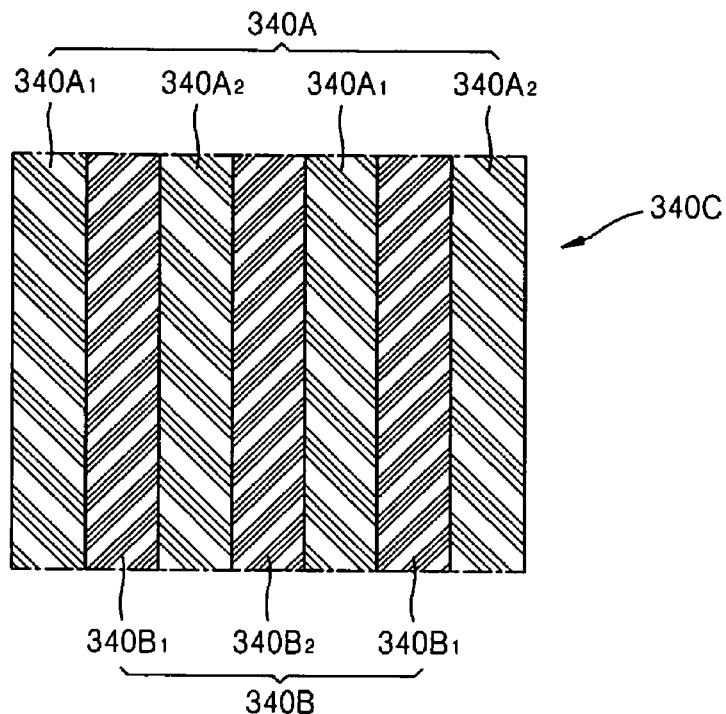
FIG. 3 illustrates a plan view of a fine pattern layer formed by a method of forming a fine pattern according to an embodiment.

FIG. 3 illustrates a plan view of a fine pattern layer 340C. The fine pattern layer 340C may have the same arrangement structure as the fine pattern layer 140C or 240C (refer to FIG. 1E and FIG. 2B) if the top-view shape of the plurality of openings 130H formed in the photoresist pattern 130A (refer to FIG. 1C) and the top-view shape of the plurality of openings 230H formed in the photoresist pattern 230A (refer to FIG. 2A) include linear shapes having a plurality of lines parallel to each other.

The fine pattern layer 340C may be self-assembled on portions of the organic guide layer 120 exposed via the openings 130H or the openings 230H, using the exposed portions as a guide. First blocks 340A and second blocks 340B may be arranged to have linear shapes including a plurality of lines parallel to each other. In FIG. 3, the fine pattern layer 340C formed of the first blocks 340A and the second blocks 340B may correspond to the fine pattern layer 140C (refer to FIG. 1E) formed of the first blocks 140A and the second blocks 140B, according to an embodiment of the inventive concept. Alternatively, the fine pattern layer 340C may correspond to the fine pattern layer 240C (refer to FIG. 2B) formed of the first blocks 240A and the second blocks 240B, according to an embodiment of the inventive concept.

If the fine pattern layer 340C corresponds to the fine pattern layer 140C, the first blocks 340A may include a plurality of first lines $340A_1$, which overlap the portions of the organic guide layer 120 exposed via the plurality of openings 130H, and at least one second line $340A_2$, which extends on the photoresist pattern 130A between two adjacent openings 130H and may be parallel to the first lines $340A_1$. The second blocks 340B may include a plurality of lines $340B_1$ and $340B_2$ that may be arranged in parallel to and alternately with the first lines $340A_1$ and the at least one second line $340A_2$ between the first lines $340A_1$ and the at least one second line $340A_2$.

Since operations of forming a fine pattern when n=1 is exemplified above with reference to FIGS. 1A through 1H, the width of the photoresist pattern 130A may be 3 times that of the openings 130H. Therefore, one first line $340A_1$ may be formed to correspond to one opening 130H, while three lines, i.e., one second line $340A_2$ between two lines 340B may be formed on the photoresist pattern 130A.

Figure 4:
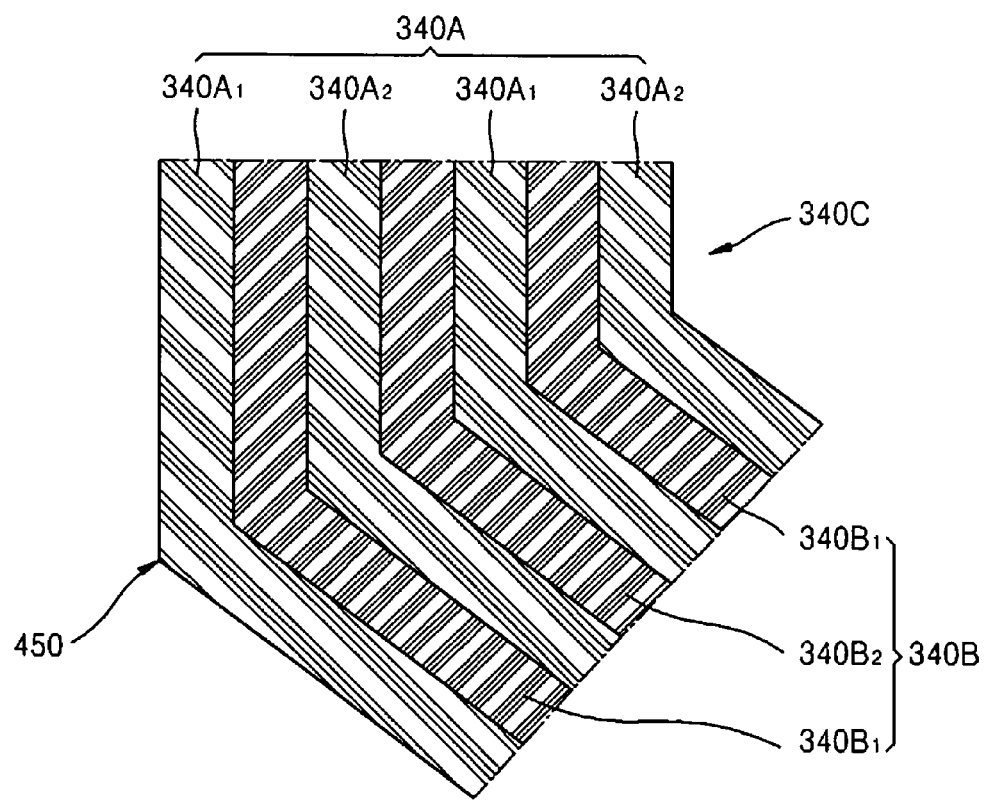
FIG. 4 illustrates a plan view of a fine pattern layer formed by a method of forming a fine pattern according to an embodiment.

FIG. 4 illustrates a plan view of a case where the plurality of openings 130H formed in the photoresist pattern 130A according to an embodiment may have a top-view shape including a plurality of lines parallel to each other and have at least one bending point. In other words, the fine pattern layer 340C on the plurality of openings 130H may have a bending point 450. The configuration of the fine pattern layer 340C illustrated in FIG. 4 is identical to that illustrated in FIG. 3, except that the fine pattern layer 340C of FIG. 4 includes the bending point 450.

Figure 5:
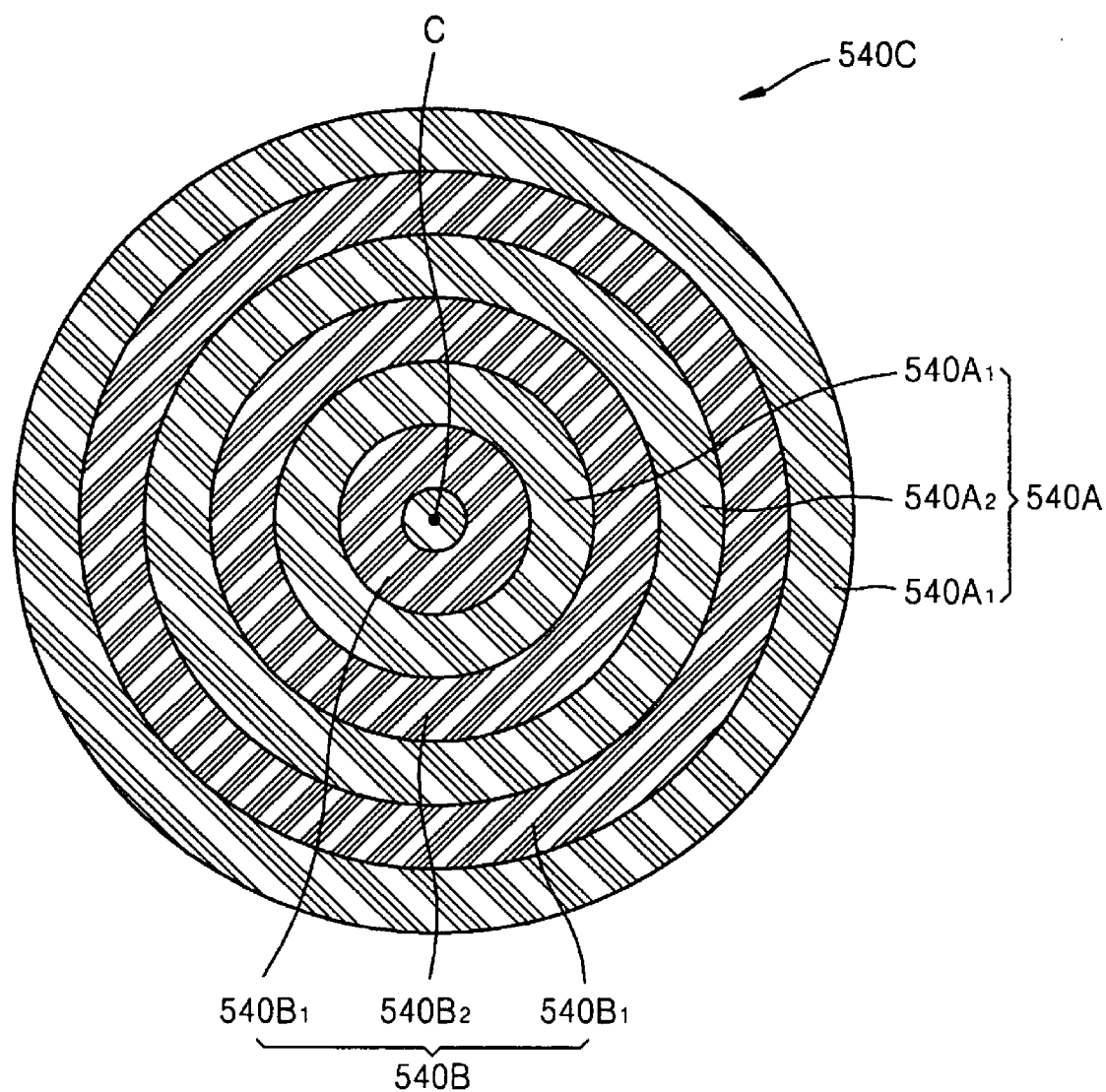
FIG. 5 illustrates a plan view of a fine pattern layer formed by a method of forming a fine pattern according to an embodiment.

FIG. 5 illustrates a plan view of an arrangement structure of a fine pattern layer 540C when the plurality of openings 130H formed in the photoresist pattern have a top-view shape of a plurality of circular lines repeatedly arranged to form concentric circles around a predetermined location C on the substrate 100.

The fine pattern layer 540C may be self-assembled on portions of the organic guide layer 120 exposed via the openings 130H, using the exposed portions as a guide. First blocks 540A and second blocks 540B of the fine pattern layer 540C may be alternately arranged in the form of concentric circles around the location C. The fine pattern layer 540C formed of the first blocks 540A and the second blocks 540B illustrated in FIG. 5 may correspond to the fine pattern layer 140C formed of the first blocks 140A and the second blocks 140B, according to an embodiment of the inventive concept.

In FIG. 5, the first blocks 540A of the fine pattern layer 540C may include a plurality of first circular lines $540A_1$, which overlap the portions of the organic guide layer 120 exposed via the plurality of openings 130H, and at least one second circular line $540A_2$, which may be formed as a concentric circle on the photoresist pattern 130A between two adjacent openings 130H together with the first circular lines $540A_1$. The second blocks 540B may include a plurality of circular lines $540B_1$ and $540B_2$ that may be arranged alternately with the first circular lines $540A_1$ and the at least one second circular line $540A_2$ between the first circular lines $540A_1$ and the at least one second circular line $540A_2$.

Since operations of forming a fine pattern when n=1 are exemplified above with reference to FIGS. 1A through 1H, the width of the photoresist pattern 130A may be 3 times that of the openings 130H, and one second circular line $540A_2$ may be formed on the photoresist pattern 130A.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a fine pattern, the method comprising:
   forming an organic guide layer on a substrate;
   forming a photoresist pattern having a first height on the organic guide layer, the photoresist pattern including a plurality of openings exposing portions of the organic guide layer;
   forming a material layer having a second height greater than the first height on the exposed portions of the organic guide layer and on the photoresist pattern, the material layer including block copolymers; and
   rearranging the material layer through phase separation of the block copolymers into a fine pattern layer covering the organic guide layer and a top surface of the photoresist pattern, the fine pattern layer including a plurality of first blocks and a plurality of second blocks arranged in an alternating pattern, the plurality of first blocks and the plurality of the second blocks having different repeating units of the block copolymers.

2. The method as claimed in claim 1, wherein forming the organic guide layer includes forming an organic anti-reflective film or a hexamethyldisilazane (HDMS) film.

3. The method as claimed in claim 1, wherein each of the plurality of first blocks in the fine pattern layer has a substantially same width as a single opening of the photoresist pattern.

4. The method as claimed in claim 1, wherein rearranging the material layer through phase separation includes rearranging components of the block copolymers of the material layer according to differences of surface characteristics between the exposed portions of the organic guide layer and the photoresist pattern.

5. The method as claimed in claim 1, wherein a width of a single opening of the photoresist pattern and a width of a single portion of the photoresist pattern are related according to equation:

$$Y=(2n+1)X,$$

wherein X is the width of the single opening, Y is the width of the single portion of the photoresist pattern, the single portion of the photoresist pattern being positioned between two adjacent openings, and n is a positive integer.

6. The method as claimed in claim 5, wherein the openings of the photoresist pattern are repeatedly formed to define a first pitch P. of the photoresist pattern, the plurality of first blocks and the plurality of second blocks being repeatedly and alternately arranged in the fine pattern layer at a second pitch $P_{BC}$ smaller than the first pitch $P_x$, the second pitch $P_{BC}$ being expressed as $P_{BC}=[1/(n+1)]\cdot P_x$.

7. The method as claimed in claim 1, wherein the plurality of first blocks exhibits a greater hydrophilic affinity than the plurality of second blocks, the first blocks being self-assembled on the exposed portions of the organic guide layer.

8. The method as claimed in claim 1, wherein rearranging the material layer through phase separation includes annealing the material layer at a temperature higher than a glass transition temperature of the block copolymers.

9. The method as claimed in claim 1, wherein forming the organic guide layer includes forming a film with a higher hydrophilic affinity than the photoresist pattern.

10. The method as claimed in claim 9, wherein forming the photoresist pattern on the organic guide layer includes forming a photoresist pattern having a neutral surface and openings exposing hydrophilic surfaces of the organic guide layer, the neutral surface of the photoresist pattern being neither hydrophilic nor hydrophobic.

11. The method as claimed in claim 9, wherein the first blocks of the fine pattern layer are formed to include first polymer blocks of the block copolymers and the second blocks of the fine pattern layer are formed to include second polymer blocks of the block copolymers, the first and second polymer blocks having different hydrophilic affinity.

12. The method as claimed in claim 1, wherein the first blocks of the fine pattern layer are formed to include first polymer blocks of the block copolymers and the second blocks of the fine pattern layer are formed to include second polymer blocks of the block copolymers, the first and second polymer blocks being different polymers from each other, and the first blocks being self-assembled on the exposed portions of the organic guide layer through the phase separation.

13. The method as claimed in claim 12, wherein the second blocks of the fine pattern layer are self-assembled only on the photoresist pattern through the phase separation.

14. The method as claimed in claim 1, wherein the plurality of first blocks includes a first group of first blocks contacting with the organic guide layer and a second group of first blocks contacting with the top surface of the photoresist pattern.

15. The method as claimed in claim 1, wherein the plurality of second blocks contacts with the top surface of the photoresist pattern.

16. The method as claimed in claim 1, wherein at least one of the plurality of first blocks is self-arranged on the exposed portions of the organic layer through the plurality of openings, and
wherein the plurality of openings and the at least one of the plurality of first blocks have the same or substantially the same width.

17. A method of forming a fine pattern, the method comprising:
forming an organic guide layer on a substrate;
forming a photoresist pattern on the organic guide layer, the photoresist pattern including a plurality of openings exposing portions of the organic guide layer;
forming a material layer on the exposed portions of the organic guide layer and on the photoresist pattern, the material layer including block copolymers;
rearranging the material layer through phase separation of the block copolymers into a fine pattern layer, such that the fine pattern layer includes a plurality of first blocks and a plurality of second blocks arranged in an alternating pattern, the plurality of first blocks and the plurality of the second blocks having different repeating units of the block copolymers;
forming a fine pattern mask by removing either the plurality of first blocks or the plurality of second blocks from the fine pattern layer, the fine pattern mask exposing the organic guide layer and a portion of a top surface of the photoresist pattern; and
partially etching the exposed organic guide layer and the exposed top surface of the photoresist pattern by using the fine pattern mask as an etching mask.

18. The method as claimed in claim 17, further comprising:
forming a target film between the substrate and the organic guide layer; and
etching the target film by using the fine pattern mask as an etching mask after the etching of the organic guide layer and the top surface of the photoresist pattern.

* * * * *